(12) United States Patent
Tandle et al.

(10) Patent No.: US 7,052,564 B2
(45) Date of Patent: May 30, 2006

(54) COMPONENT FEEDER HAVING A HIGH DENSITY COVER TAPE RESERVOIR

(75) Inventors: Louis Tandle, Rochester, NY (US); Gregory A. Holcomb, Rochester, NY (US); John Piccone, Webster, NY (US)

(73) Assignee: Delaware Capital Formation, Inc., Wilmington, DE (US)

( * ) Notice: Subject to any disclaimer, the term of this patent is extended or adjusted under 35 U.S.C. 154(b) by 0 days.

(21) Appl. No.: 10/808,748

(22) Filed: Mar. 25, 2004

(65) Prior Publication Data

US 2004/0191033 A1 Sep. 30, 2004

Related U.S. Application Data

(60) Provisional application No. 60/458,801, filed on Mar. 28, 2003.

(51) Int. Cl.
*B32B 37/00* (2006.01)

(52) U.S. Cl. ............ 156/64; 156/200; 156/205; 156/227; 156/344; 156/361; 156/462; 156/584

(58) Field of Classification Search .......... 156/64, 156/196, 199, 200, 205, 226, 227, 247, 344, 156/443, 459, 461, 462, 580, 582, 584, 361
See application file for complete search history.

(56) References Cited

U.S. PATENT DOCUMENTS 5,562,384 A * 10/1996 Alvite et al. .......... 414/226.01
5,725,140 A * 3/1998 Weber et al. ............... 226/139
6,162,007 A * 12/2000 Witte ..................... 414/416.01
6,347,655 B1 * 2/2002 Yamamoto et al. ......... 156/540
6,402,452 B1 * 6/2002 Miller et al. ............... 414/412
6,695,032 B1 * 2/2004 Kim .......................... 156/582
2002/0066530 A1   6/2002 Kim

OTHER PUBLICATIONS

3M Technical Bulletin dated Nov. 2001 entitled "Prevention of Pressure Sensitive Adhesive Cover Tape Jamming in Feeders with Nip Gear and/or Collection Bins Systems".
Hover-Davis SF01 Series Tape Feeder Operators Guide; c. 2003; Hover-Davis, Inc. Revision 2; Jan. 28, 2003; No. 700D-E02 www.hoverdavis.com.

* cited by examiner

*Primary Examiner*—James Sells
(74) *Attorney, Agent, or Firm*—Basch & Nickerson LLP; Duane C. Basch

(57) ABSTRACT

A method and apparatus for the handling and containment of a cover tape peeled from a pocket tape in a component feeder are disclosed. A single folding pulley comprising inclined sides and an undercut at the hub folds the adhesive contaminated edges back onto themselves so as to captivate the adhesive therebetweeen. A cover tape reservoir, having an internal cavity defined by a curved perimeter and treated sides, stores the folded cover tape. The remaining reservoir capacity is monitor in software for fullness. The cover tape is corrugated to allow for maximum packing density with a minimum of voids as it is pushed into the reservoir.

15 Claims, 6 Drawing Sheets

COMPONENT FEEDER HAVING A HIGH DENSITY COVER TAPE RESERVOIR

Priority is claimed from U.S. Provisional Application No. 60/458,801, for a "COMPONENT FEEDER HAVING A HIGH DENSITY COVER TAPE RESERVOIR," by Tandle et al., filed Mar. 28, 2003, which is also hereby incorporated by reference for its teachings.

RELATED APPLICATIONS

The following application is hereby incorporated by reference for its teachings:
"REVOLVING COVER TAPE RESERVOIR FOR A COMPONENT FEEDER," David Lyndaker et al., application Ser. No. 10/042,601, filed Jan. 9, 2002.(abandoned).

This invention relates generally to a component feeder, and more particularly to a component tape feeder whereby a high volume of expended cover tape is gathered into a reservoir contained within the component tape feeder.

BACKGROUND AND SUMMARY OF THE INVENTION

Components, including electrical devices and other items to be placed on printed circuit boards (PCB) and the like, are often supplied within a pocket carrier tape that has been wound onto a reel for mounting within a component feeder. The carrier tape consists of two parts; (1) a flexible base of paper, metal or plastic having depressions or pockets in series at regular intervals along its length and (2) a thin continuous film forming an over-cover of the component pocket. The pocket tape also includes a plurality of through-holes spaced along the lengthwise edge at a predefined pitch, generally on the order of 2 mm, wherein a drive roller is able to engage the holes and advance the tape a controlled distance so as to accurately position the pocket at the component retrieval station or pick point within the feeder mechanism.

Placed within each pocket is one component to be retrieved and positioned onto the PCB by means of a robotic arm within the assembly machine. The components are mechanically and hermetically secured within their respective pockets using a thin transparent material, commonly referred to as "cover tape" that extends the entire length of the pocket tape, and is just slightly wider than the pocket that it covers. The cover tape is typically fastened or affixed to the pocket tape with a pressure or temperature activated adhesive along each of its longitudinal edges, thus forming the combination of the cover tape and the pocket tape to provide a serial string of sealed component vessels.

In component tape feeders the tape feeder advances the pockets to a pre-defined position commonly referred to as a "pick point" or "pick-up location". As the component is advanced from of a supply reel, the cover tape is typically pulled and peeled back from the pocket tape, just prior to the pick point, so as to expose the component contained therein and thus provide a direct access to the component by a pick up-nozzle located within the pick and place printed circuit board assembly machine.

Therefore it can be appreciated that component tape feeders are an essential element for the orderly, rapid and sequential delivery of individual surface-mountable components to an assembly machine having an automated or robotic head for retrieving the component from the pocket and placing the component onto the surface of a printed circuit board being assembled.

A long-standing problem with this technology has been the disposal of the two segregated elements of the used component tape; the cover tape and the pocket tape portions. The base segment of the component carrier tape, being the rather bulky pocket tape, is generally expelled directly out the bottom of the component feeder into a large waste bin where it is often chopped into short lengths for subsequent disposal. The spent cover tape, on the other hand, is peeled in the upper region of the component feeder and is physically segregated from the pocket tape waste bin by the incoming component carrier tape and the feeder mechanism. Accordingly, a discrete cover tape waste collection method and system is required to be located within the upper area of the feeder.

Two principal methods are currently employed for collecting the waste cover tape. The first is to wind the cover tape on a take-up reel located above and just behind the pick point. A known problem with this method is that in order for the take-up reel to be re-used a full take-up reel must be manually unwound so as dispose the tape and reclaim the take-up reel. In addition, the leading edge of the cover tape must be threaded and cinched within the hub of the take-up reel each time the take-up reel is emptied.

A second method of handling the cover tape, once it is peeled back from the carrier tape, involves the use of a pair of pinch rollers to push the cover tape into a waste collection reservoir, which is generally emptied each time a replacement reel of components is loaded into the feeder. While such a system resolves the issues of attaching and the un-winding of the cover tape with the take-up reel method, it still requires the operator to routinely remove and dispose of the cover tape each time the feeder is re-loaded, and in some cases between re-loading wherein the volume of the waste reservoir may be insufficient to retain the cover tape removed from a reel of components, thus resulting in an interruption of the assembly process to allow for operator intervention to empty the cover tape out of the reservoir. In the alternative, it is not uncommon for the reservoir to retain more than one reel of cover tape. Given the variances of parts/reel and the variety of cover tape composition there is little to no synchronization between a reel of components and cover tape reservoir capacity.

An apparent solution to decreasing the frequency of empting the used cover tape would be to increase the capacity of the reservoir by simply increasing the volume. However, in a majority of the feeders there are design limitations that restrict the footprint of the reservoir. Accordingly, attention is directed to the other side of the volume equation, that is to improve the packing density of the cover tape in the reservoir while the volume remains a constant.

Inherently cover tape is difficult to manage for a few reasons; (1) it has very limited beam strength, (2) it readily acquires a charge and, therefore, suffers bi-polar attraction or "static cling" and (3) it contains residual pressure sensitive adhesive (PSA) that can readily migrate to the inner surface of the reservoir and contaminate the cover tape transport. While there are various solutions for static dissipation issues, the problem of pushing a large quantity of insubstantial and sticky thin film into a reservoir remains a pressing issue.

The present invention addresses the aforementioned cover tape collection problems described above by (1) controlling the beam strength of the thin film cover tape, and (2) mitigating PSA migration within the feeding apparatus. Additionally, it was discovered, that variations to the geometric profile and an innovative surface finish of the reservoir proved to be enabling in enhancing the packing density of the reservoir as measured in linear inches of cover tape per cubic inch volume of the collection reservoir, or D=in/in$^3$ where D is a unit of packing density expressed in inches of cover tape.

One aspect of the invention deals with the basic problem of controlling the bending moment of a cover tape, having a planar cross sectional thickness of approximately 0.0025 inches, when subjected to the compressive force required to push the tacky thin film web into a collection reservoir. The resultant of handling flimsy material in this manner is a localized mass of balled-up tape positioned in direct proximity of the entrance to the reservoir. Eventually a jam will occur where the tape back feeds and wraps around the rollers of the cover tape drive system, thus jamming the mechanism and preventing additional cover tape from being pushed into the reservoir. In a 3M Technical Bulletin dated November 2001 entitled "*Prevention of Pressure Sensitive Adhesive Cover Tape Jamming in Feeders with Nip Gear and/or Collection Bins Systems*" there is disclosed an arrangement of two or more rollers that fold the edges of the cover tape, along the longitudinal sides of the cover tape, back onto themselves and thereby encapsulate the PSA therebetween. However it is notable that this process also produces a 2-ply cover tape resulting in a substantial increase in column strength and thickness. This approach works well in isolating the PSA, and provides rigidity to assists in the pushing of the cover tape into the reservoir. However, upon further analysis, it was discovered that this added stiffness of the cover tape may actually limit the ability for the tape to freely flow within the reservoir due to the lack of compliance of the cover tape within the confined perimeter of the reservoir. Preferably, upon the tape exiting the drive mechanism and just entering the reservoir, it would be advantageous to have the thin film respond as if it were again in a "liquid state", that is to say, the cover tape should preferably react within the cover tape drive gears as a rigid member and then experience a change in state upon entering the reservoir, whereas the tape should desirably respond as if it was being "poured" into the reservoir cavity, thus reducing voids or air pockets within the reservoir. Accordingly, the present invention discloses a unique process whereby the cover tape drive gears corrugate the cover tape and thus provide for an unanticipated improvement in packing density.

In accordance with another aspect of the present invention, consecutive component carrier tapes are often connected together by overlapping the ends and adhering or splicing one to another with splicing tape applied on one side only. Component tape splicing is an evolving process in the industry that provides for a continuous supply of components, without having to stop and reload a new component tape into the feeder. However, when folding and bending the cover tape within a folding pulley the splice and the cover tapes have a tendency to peel apart during the edge folding operation. Accordingly there has been provided in one embodiment of the present invention a splice deflector operatively associated with the folding pulley mentioned above. While the splice material has a propensity to delaminate from the cover tape when a transverse bending moment and a longitudinal rotational force is applied to the cover tape, the splice deflector provides a holding force along the top side of the cover tape to guide the protruding end of the cover tape as the splice is drawn through the folding pulley.

In accordance with one aspect of the present invention, there is provided a distinctive geometric contour of the perimeter of the cover tape reservoir that promotes a laminar flow during the consolidation of the cover tape into a uniform mass. This aspect is based on the discovery that curvilinear profiles strategically placed along the perimeter of the reservoir provides for a more homogeneous and uniform collection of the cover tape, thereby avoiding, or at best reducing, the areas of low packing density within the reservoir.

In accordance with another aspect of the present invention, there is provided a cover tape reservoir having formed on at least one interior surface a texture or treatment that minimizes the adhesion and/or friction between the cover tape and the stationary sides of the reservoir. This surface profile has a substantially irregular and random finish that minimally contacts the cover tape.

In accordance with yet another aspect of the present invention there is provided a single folding pulley having undercut inclined flanges with a width less than the width of the tape so as the edges of the tape are encourage to fold inwardly onto themselves.

In accordance with yet another aspect of the present invention, there is provided a cover tape drive system comprising a driven gear mechanically engaged to a spring tensioned normal force idler gear. The tension, which provides the force to peel the cover tape from the pocket tape, is imparted to the cover tape by passing through the nip point of the engaging gears resulting in a pulling, as well as pushing, force onto the cover tape. While the distortion of the cover tape engaged between the meshing gears limits slippage, an additional benefit provides for the "corrugating" of the tape into minute segments, whereby individual segments have notable column strength afforded by the previously mentioned folding process. However when taken together as a continuous strip the entire corrugated tape has virtually no column strength, as is the case with most linked members, for example, a chain having rigid links with fulcrums therebetween. This corrugating or pleating of the cover tape has been found to be advantageous based on the discovery that once the drive gears have expelled the cover tape past the nip of the gears, the corrugating of the tape allows for it to be compliant within the remaining space available in the reservoir. In principle the tape is forcibly inserted into the reservoir one "link" or segment at a time as the tape freely fills the reservoir, the unanticipated resultant being a significant increase in packing density In accordance with yet another aspect of the present invention, there is provided a system for automatically advising the operator of a relatively full reservoir. This technique relies on the real-time measurement of the component tape length and then comparing this measurement to a pre-determined reservoir capacity table, where various levels of fullness are set forth (e.g., "almost full"=0.9×N inches and "full to capacity"=N inches). A carrier tape drive, via an encoder, records in software the amount of cover tape that has passed through the feeder since the reservoir was last emptied. An algorithm in software empirically determines the point where, based upon the measured length and the aforementioned table, the reservoir is "almost full" and the operator is initially signaled, or "full to capacity" where the operator is required to evacuate the cover tape from the reservoir in order to resume operation of the feeder. A sensor resets the software gauge once the reservoir has been emptied and the access door closed.

In accordance with an alternative to the software algorithm for gauging the amount of tape contained within the reservoir, there is provided an electromechanical means to monitor the packing density of the cover tape within the reservoir. The current (milliamps) drawn by the DC motor driving the cover tape drive gears is measured and correlated to a current versus. packing density table contained within the software. Fundamentally the cover tape in the reservoir provides a back force that progressively increases the amount of torque, and therefore current, required to push on the cover tape as it fills the reservoir. This invention is based on the discovery that the load on the DC motor varies appreciably as a function of the amount of cover tape contained within the reservoir. An empirically derived table, based on the direct relationship between current and voltage, provides the following algorithm for feedback in order to estimate "fullness" where; Torque (T)=Current (I)×Voltage (E). Assuming the voltage (E) supplied to the motor remains a constant, the output torque of the motor is directly proportional to the current (I), measured in milliamps, as tape is forced into the reservoir. Within the current versus reservoir table there are at least two trip points, one representing a status A, almost full and status B, a full reservoir. Status A is communicated to the operator as a warning, whereas status B results in a halt of feeder operation until the cover tape has been removed from the reservoir.

The techniques described herein are advantageous because they provide simple and reliable approaches to the disposition of used cover tape from a component carrier tape. The techniques are flexible and can be adapted to any of a number of component tape feeders.

Figure 1:
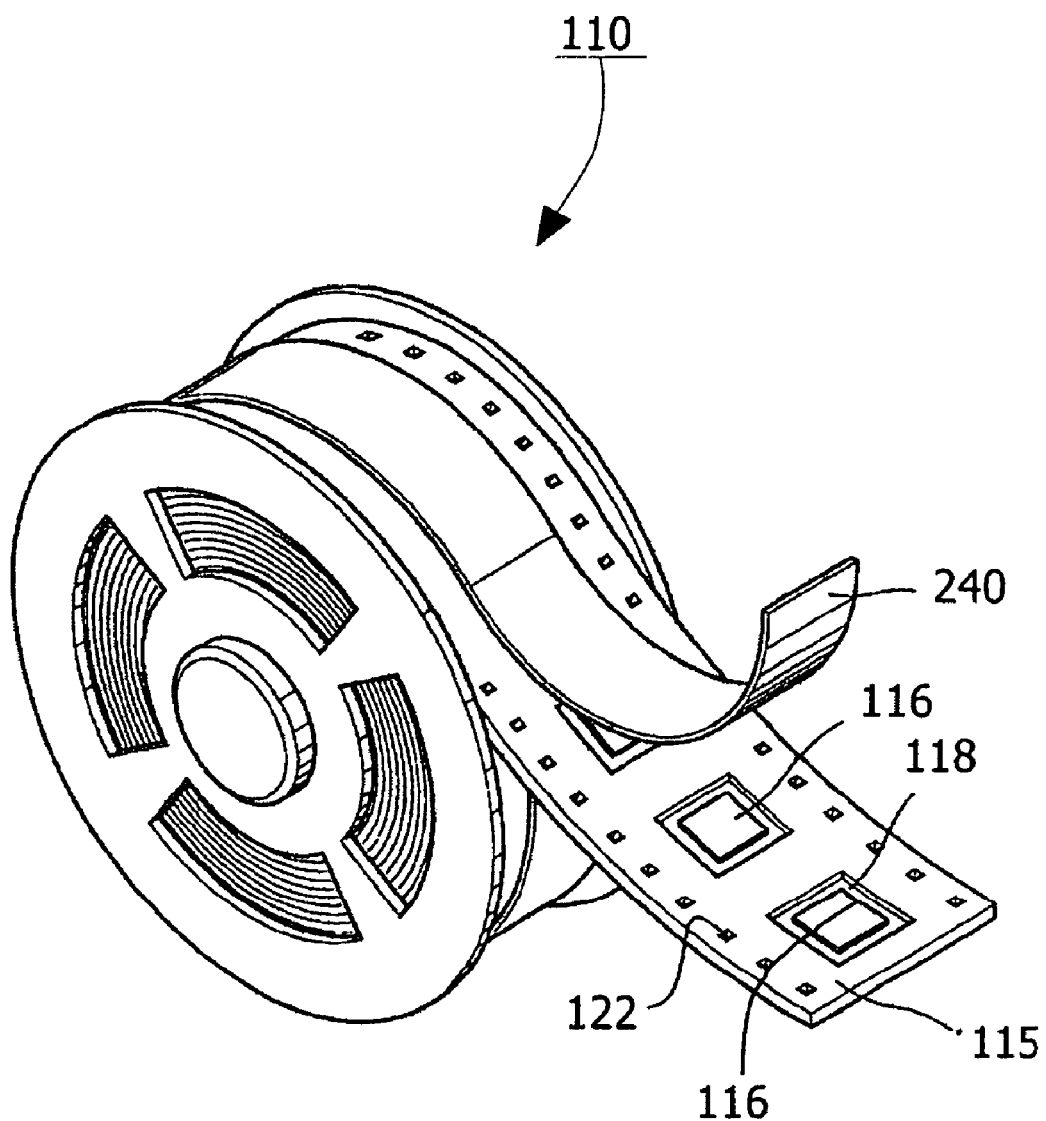
FIG. 1 is an isometric view of the component tape having components therein.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by the appended claims.

DESCRIPTION OF THE PREFERRED EMBODIMENT

For a general understanding of the present invention, reference is made to the drawings. In the drawings, like reference numerals have been used throughout to designate identical elements.

FIG. 1 shows the basic elements of component tape 110 having a pocket tape 115 containing component 116 with cover tape 240 sealing in component 116. Pocket tape 115 provides depressions wherein an electronic component 116 is captured within pocket 118 by cover tape 240. Once components 116 are exposed, by peeling back cover tape 240, components 116 are removed from pocket 118 and both the pocket tape 115 and cover tape 240 are disposed of. Upon retrieval of component 116 the tape 115 is advanced by a component tape drive 140 such as a sprocket (shown in FIG. 2) engaged in sprocket holes 122 or a roller.

Figure 2:
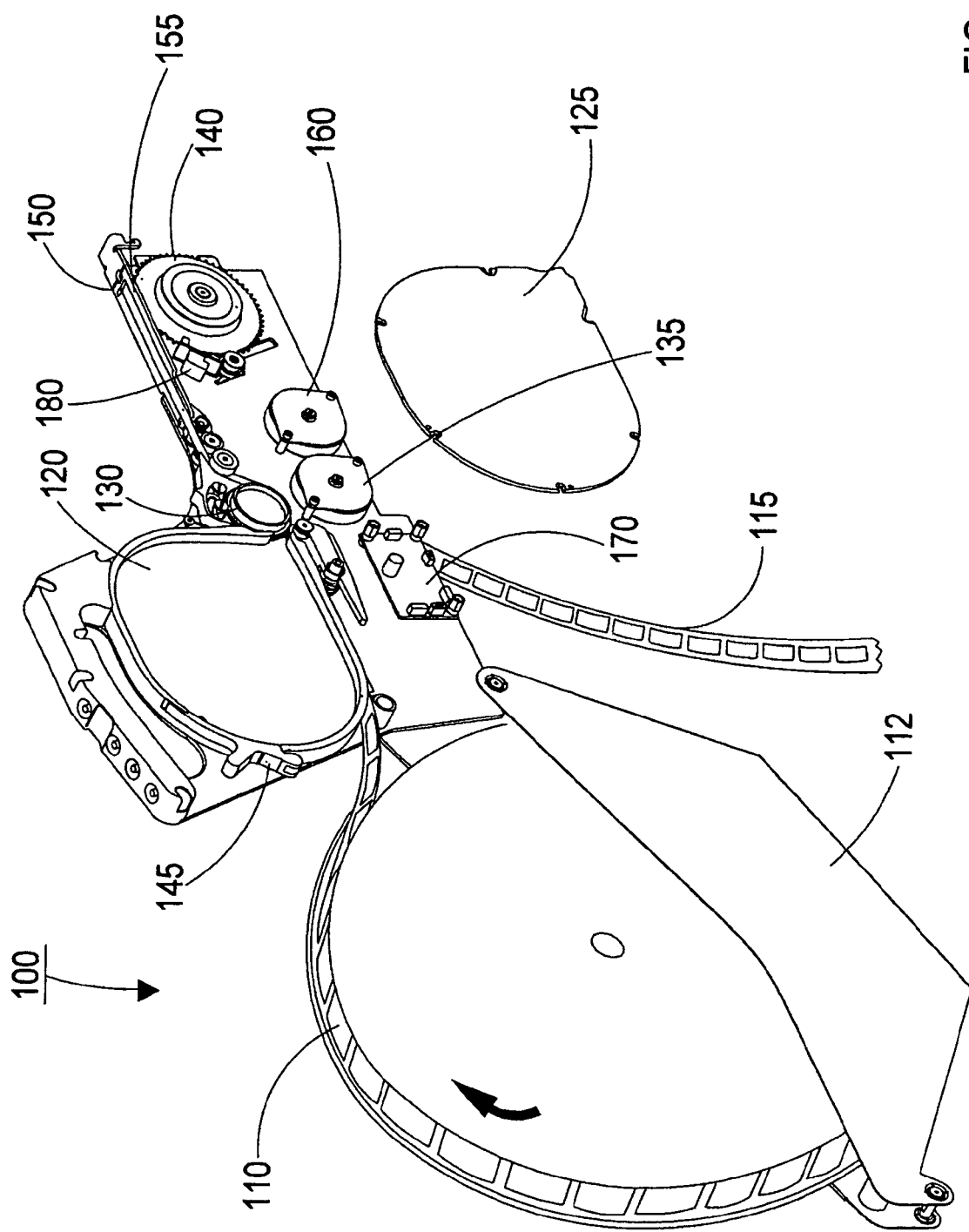
FIG. 2 is an exemplary view of a common component tape and reel feeder.
Figure 3:
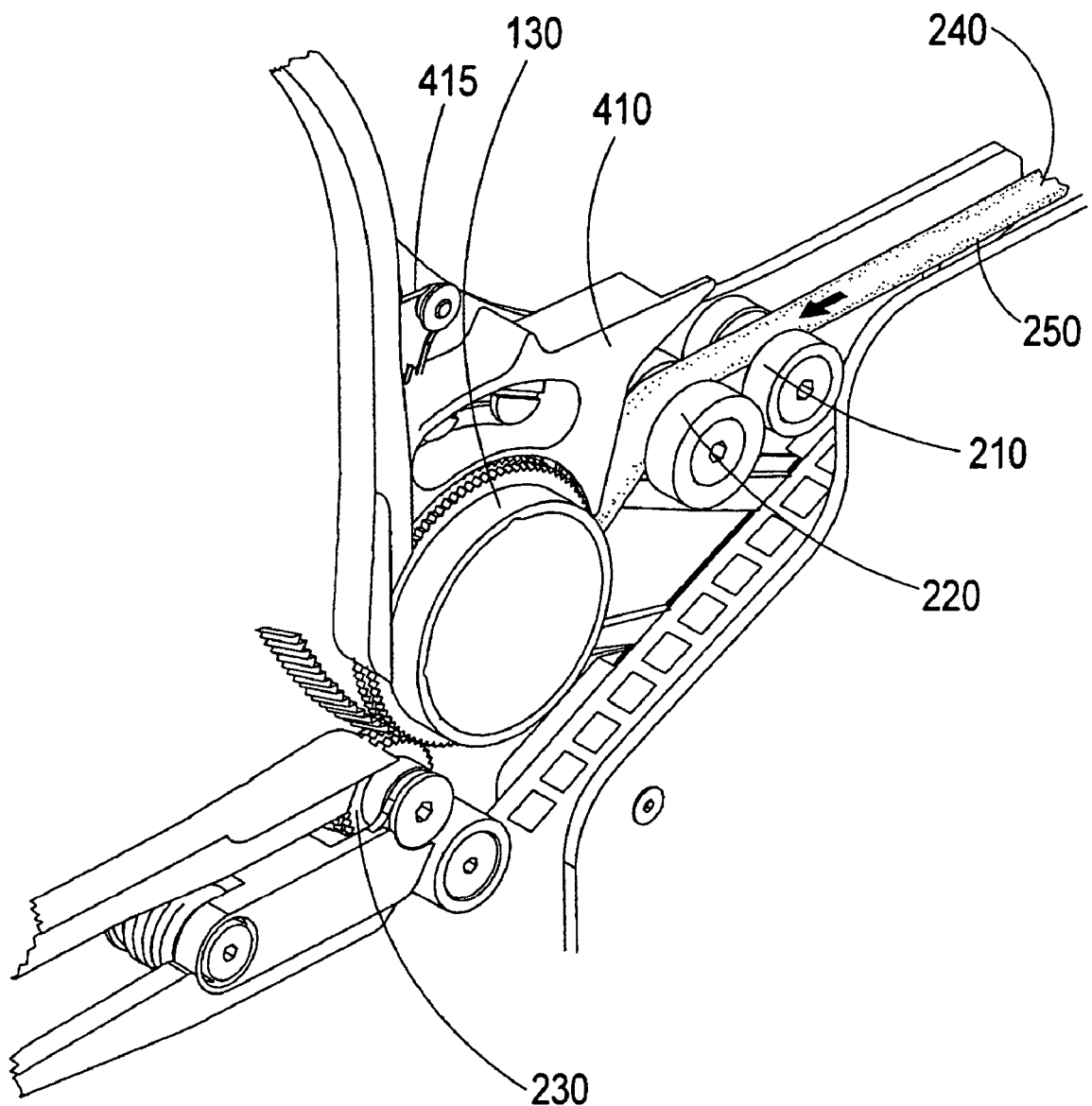
FIG. 3 is a perspective view of the cover tape folding pulley and drive rollers in accordance with the present invention.

Turning now to FIG. 2, there are depicted the fundamental elements of a component tape feeder 100, whereby the components are contained within tape and reel assembly 110 rotationally engaged within reel holder 112. The covered components 116 within the pocket tape 115 are transported toward a pick point or pick-up location at the distal area of the component feeder 100 where the cover tape 240 is pulled back over peel edge 150, contained within tape guide 155, thereby separating cover tape 240 from pocket tape 115 so as to expose components 116. The pull force to separate cover tape 240 is derived from cover tape drive gear 130 and an opposing normal force idler gear 230, which subsequently discharges the spent cover tape 240 into the cover tape waste reservoir 120. Feeder 100 preferably includes a component tape drive motor 160 operatively connected to the component tape drive 140 which may be a sprocket or a roller. Cover tape drive gear 130 may be coupled to a cover tape drive motor 135 with either a belt or a gear assembly. Feeder control electronics and software are contained within controller 170, which electrically communicates with the tape motion sensor or encoder 180, motor 135 and motor 160. In one embodiment, encoder 180 contains dual light emitters and associated photovoltaic cells whereby the teeth of the sprocket used for the component tape drive 140 pass in front of a light emitter and preclude the illumination of a photovoltaic receiver. Therefore, the sensor assembly or encoder 180 provides signals in response to the rotation of the sprocket or roller. It will be appreciated that a similar configuration may be accomplished with a friction roller used as the component tape drive 140, and that the encoder signals may be further used to indicate the direction and amount of movement of pocket tape 115, which may be calculated, for example, in inches.

The feeder control software thereby uses encoder 180 to measure the length of tape by counting the apertures or teeth and, by knowing the associated tape length per aperture, calculates the length of cover tape 240 that has passed over the peel edge 150. The measured length of cover tape 240 is compared to a reservoir capacity table to gauge the relative fullness of cover tape reservoir 120. As described above, the relative fullness is determined as a function of empirically defined values set forth in a table, which includes, among other values, an almost full value and a full to capacity value that requires the reservoir to be emptied. It will be appreciated that other sensor or monitoring methods may be employed to characterize the quantity of cover tape that has been removed and indicate when the reservoir is almost full and in need of emptying. While this method is readily implemented, it is, however somewhat dependant on a reservoir door sensor 145 being actuated to reset the software gauge once the reservoir has been cleared of cover tape.

In the alternative, it has been discovered that the amount of accumulated cover tape 240 contained within reservoir 120 can be effectively monitored by sensing the current (amperage) drawn by the cover tape motor 135 as it packs the cover tape 240 into reservoir 120. Controller 170 samples the current drawn by motor 135 and compares the measurement to a pre-determined table of values, expressed in milliamps, where the values have been empirically determined or calculated, and are indicative of the space remaining in reservoir 120. This approach is advantageous because it provides a more accurate means for determining the point where the reservoir is filled to capacity and can no longer receive additional cover tape, at which point the operator is signaled or otherwise advised to empty the cover tape reservoir.

Figure 4A:
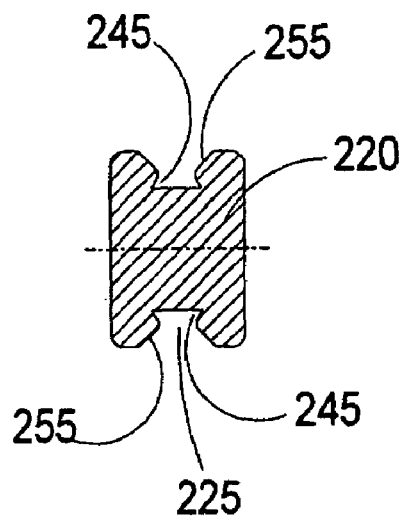
FIGS. 4A–4D illustrate a sequence of views of the cover tape folding pulley as the tape is pulled in and about the folding pulley of FIG. 3.
Figure 4B:
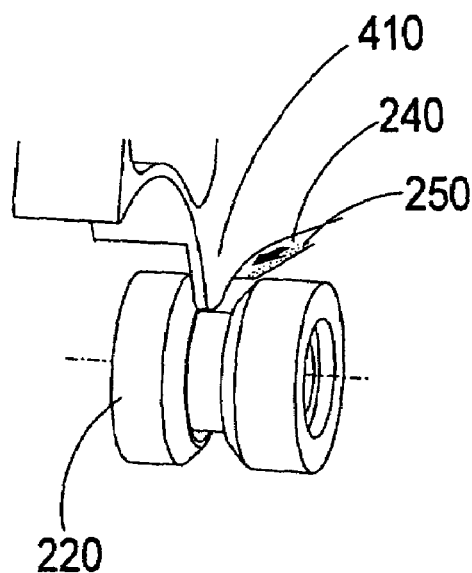
Figure 4C:
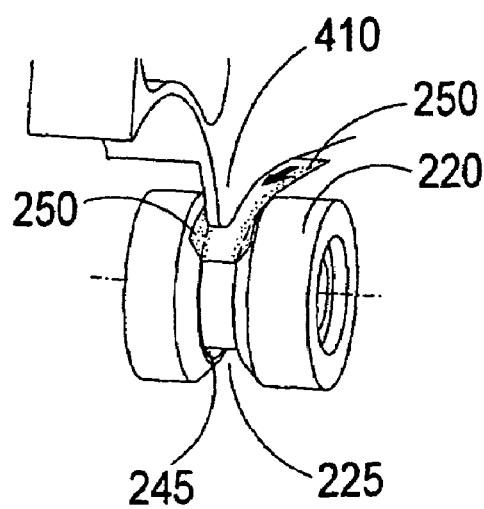
Figure 4D:
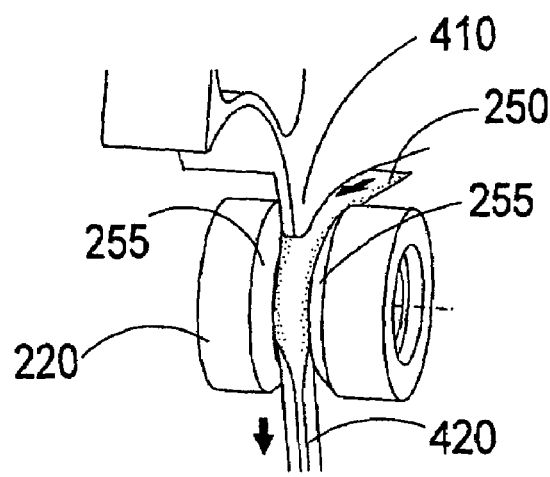

As depicted in FIGS. 3 and 4A–4D, one type of cover tape 240 often contains a residual amount of pressure sensitive adhesive 250 along each of the two outside edges. Cover tape drive gear 130 is operatively engaged with idler gear 230 and maintains the cover tape in tension to provide; (a) the force required for peeling the tape from the pocket tape and (b) the tension necessary for forming folded edges within folding pulley 220. Accordingly, cover tape 240 is drawn into folding pulley 220 where the width of the tape 240 is greater than the distance between inclined flanges 255 of the folding pulley 220. The tape, being under tension, conforms to the pulley flanges 255 and subsequently inclining the tape edges upwardly as shown in FIG. 4C. Now, the folded edges alter the width of the tape 240 sufficiently to allow the cover tape 240 to extend into the bottom of the channel 225 in FIG. 4C. Flanges 255 at core 225 of folding pulley 220 have an undercut 245, as illustrated in cross sectional view 4A of pulley 220. The tension on cover tape 240 encourages the tape edges to seat into the undercut 245 and thereby fold back onto itself, thus creating a 180 degree fold of the edges to encapsulate the residual adhesive 250 therebetween as depicted in FIG. 4D. Encapsulating the pressure sensitive adhesive 250 substantially mitigates the transfer of the adhesive 250 within the tape transport of component tape feeder 100.

Further referring to FIGS. 3, 4A–4D and 5 indicates a splice deflector 410 operatively associated with the folding pulley 220. In practice a splice provides sufficient rigidity to prevent the cover tape from being drawn near hub 225 of folding pulley 220. Additionally, the splice has a tendency to peel away from the cover tape as it is pulled over the radius of the folding pulley. Splice deflector 410 thereby performs a dual function; (1) it maintains the position of the splice within the circumferential region of the flanges 255 of the folding pulley 220 and (2) it provides a holding force against the spliced cover tape as it follows the splice while the cover tape bends about the folding pulley. Splice deflector 410 is pivotally attached to the feeder frame and is movably biased by spring 415 towards the folding pulley and onto the surface of the spliced cover tapes. Splice deflector 410 moves according to the outward reactive force generated by the interaction between the semi-rigid splice and angular flanges 255. Additionally, splice deflector 410 may be operatively displaced when initially loading the cover tape into folding pulley 220.

Figure 5:
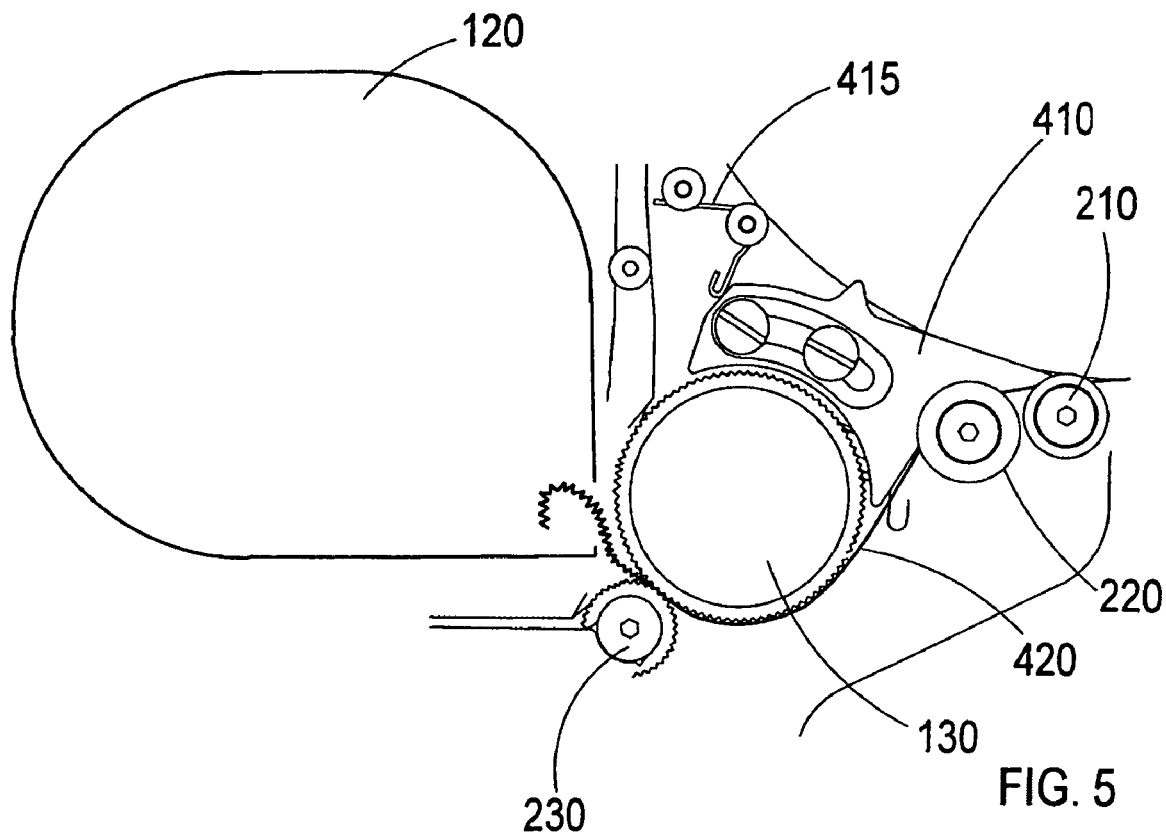
FIG. 5 is an illustration of the relationship of the cover tape folding pulley to the cover tape drive gears.
Figure 6:
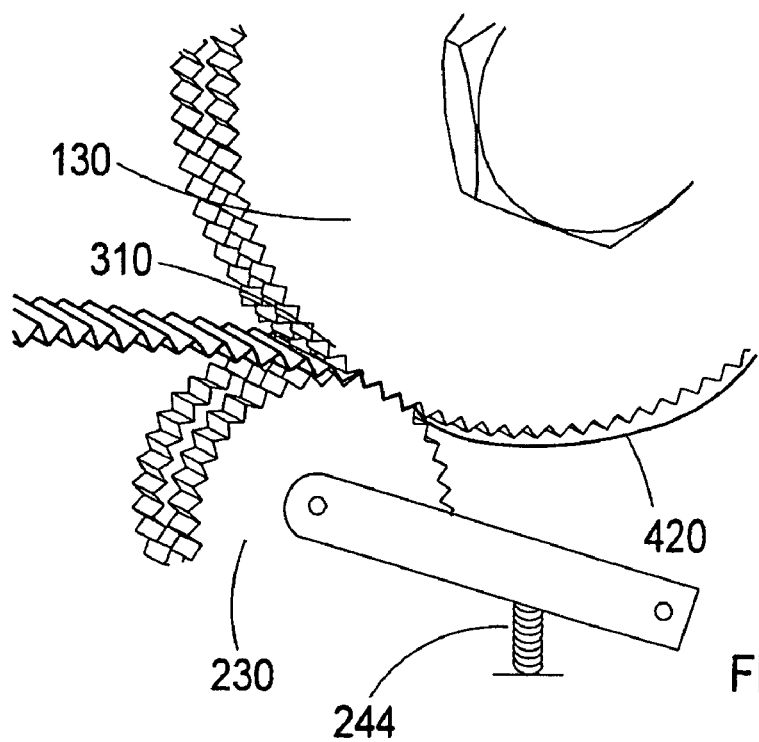
FIG. 6 is an exemplary embodiment of the tooth engagement of the cover tape drive gears and the corrugation of the cover tape.
Figures 7A, 7B:
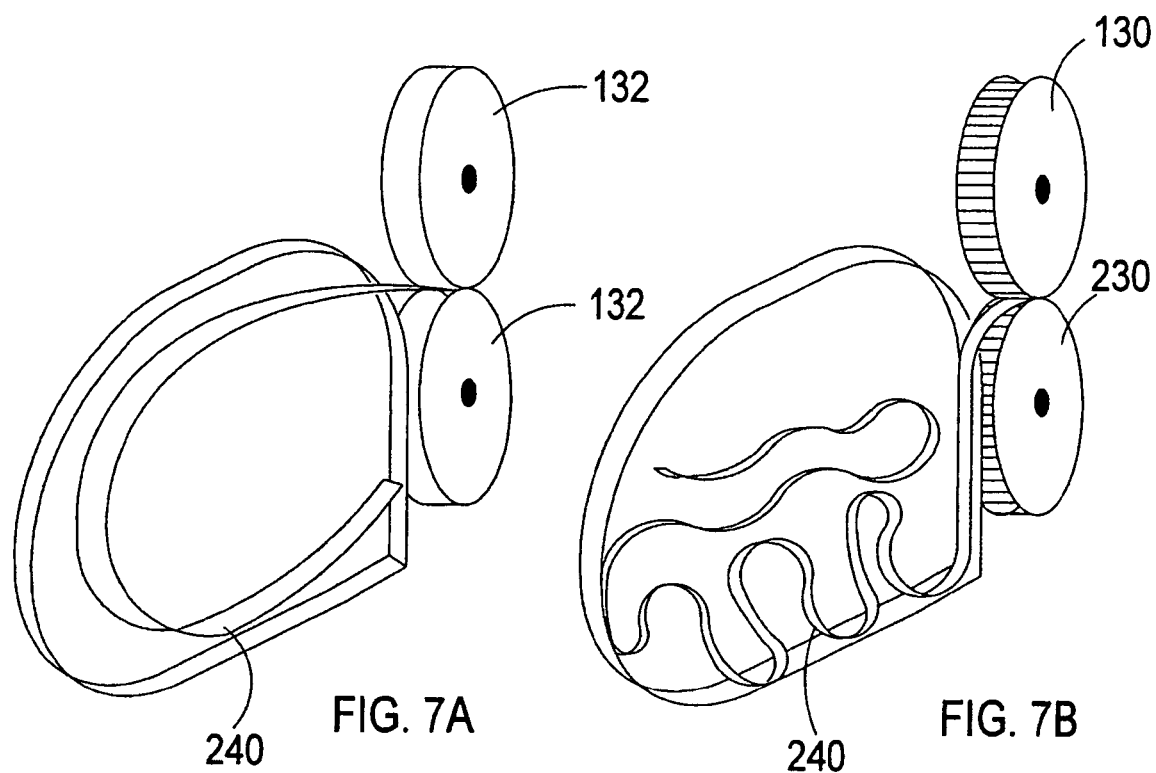
FIGS. 7a and 7b are illustrations of the trajectory of non-corrugated (a) and corrugated (b) edge folded cover tape.

Referring next to FIG. 5 in conjunction with FIG. 6, there are shown the basic structure and orientation of the cover tape folding pulley 220, alignment roller 210 and the cover tape drive and idler gears, 130 and 230 respectively, as well as their relationship to one another as referenced to the cover tape reservoir 110. The cover tape drive and corrugating mechanism consists of a pair of interactive rotary gears 130 and 230 having straight sided teeth 310 formed and positioned along their perimeter. Cover tape drive gear 130 is driven by motor 135, whereas cover tape idler gear 230 is forced into a mating relationship with drive gear 130 by virtue of the normal force applied by idler spring 244. The folded cover tape 420 passes through the nip, formed between the gears and creases the cover tape in a direction generally perpendicular to its direction of travel. The distance between the creases is approximately equal to the tooth pitch of the cover tape drive gear 130 and idler gear 230, which collectively form and define the segment size of the cover tape that is subsequently pushed into the reservoir. The surface of the tooth is planar so that the cover tape is supported between the vertex of the teeth on the driven gear and the intervening tooth of the idler gear. The meshing of the teeth on gears 130 and 230 applies a bending force to alternatively fold and permanently crease the cover tape in a back and forth manner. Accordingly, the tape to tooth contact point is fundamentally at the tip of the tooth, thereby creating an acute crease point as the cover tape is suspended between adjacent teeth 310 and the intervening tooth of the cover tape idler gear 230. The folds having parallel and alternating ridges and valleys form cover tape segments. This "corrugating" process provides a "link" point to enable the tape to freely flow into reservoir 120 as shown in FIG. 7B. In the alternative, as shown in FIG. 7A, a cover tape having only folded edges resists conformity within a defined space due to the rigidity of the folded two-ply cover tape as it is forced into cover tape reservoir 120 by smooth surface drive rollers 132.

Figure 8:
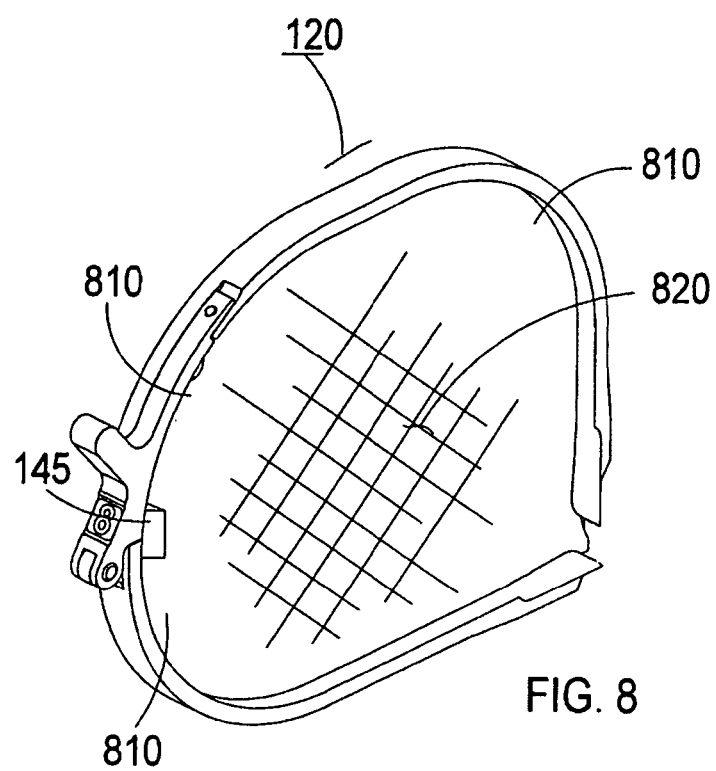
FIG. 8 is a perspective view of the perimeter area of the cover tape reservoir.

Referring next to FIG. 8, there is shown a cover tape reservoir 120 having a perimeter that is absent of any included angles. In other words, the perimeter is essentially a continuous curvilinear path so as to avoid any angles or corners along the perimeter, whereby the curvilinear profile 810 encourages the cover tape to flow along the sides of the reservoir. Additionally, to promote the unobstructed flow of the incoming cover tape, at least the planar surfaces of the reservoir include a surface texture designed to minimize the frictional forces between the moving cover tape and the fixed surfaces by substantially reducing the contact surface area. In one embodiment, a series of random grooves are incorporated into the planar surfaces 820 of the reservoir 120 and its associated cover 125 (FIG. 2). It will be appreciated that this surface texture on one or more reservoir surfaces may be achieved by surface treatments such as sand blasting or peening, as well as various non-randomized machining operations. Additionally, it is possible to chemically erode one or more of the reservoir inner surfaces or mold a pattern thereon to alter the finish so as to reduce the surface contact area with the cover tape.

In recapitulation, the present invention is a method and apparatus for the efficient containment of spent cover tape by improving the means by which the tape is presented to a reservoir that has a geometric shaped tuned to the free flow of the cover tape. The objective to provide a higher cover tape packing density within the same reservoir is accomplished and monitored in accordance with the present invention. It is, therefore, apparent that there has been provided a component tape feeder having a high density cover tape reservoir and fullness monitor in accordance with the present invention. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

What is claimed is:

1. A component tape feeder for supplying pocket tape having components contained therein and a cover tape affixed to a top surface of the pocket tape for retaining the components therein, the component tape feeder consisting of:

a tape guide having a peel edge to facilitate the removal of the cover tape from the top surface of the pocket tape before the components reach a pick-up location;

a component tape drive for engaging the pocket tape and advancing said components through said tape guide;

a single folding pulley for encouraging at least one longitudinal fold to be formed within the cover tape once removed at the peel edge;

a cover tape drive;

a control unit, associated with the component tape drive;

a motor for powering at least one of said component tape drive and cover tape drive; and a cover tape reservoir for receiving folded cover tape therein.

2. The component tape feeder of claim 1, wherein the single folding pulley comprises two inwardly inclined flanges, each of said inwardly inclined flanges including an undercut between each of said inclined flanges and a pulley hub.

3. The component tape feeder of claim 1, wherein the control unit receives a signal from said component tape drive indicating the amount of cover tape advanced, wherein the control unit calculates, as a function of the amount of cover tape advanced through said tape guide, the remaining cover tape capacity of the reservoir, wherein the control unit further provides a reservoir fullness gauge by calculating the state of fill of the cover tape reservoir as a function of the amount of cover tape advanced.

4. The component tape feeder of claim 1, wherein said control unit further includes means for measuring a force required to deposit the cover tape into the cover tape reservoir and providing a signal thereof to the control unit, wherein the cover tape reservoir fullness is estimated by the control unit as a function of the force required to deposit cover tape into the cover tape reservoir wherein the means for measuring a force measures the current drawn by a motor operatively engaged to the cover tape drive, where the current is employed to estimate the remaining capacity of the cover tape reservoir.

5. The component tape feeder of claim 1, wherein said cover tape reservoir has at least one interior surface that is treated so as to reduce the frictional force between the interior surface and the cover tape.

6. The component tape feeder of claim 1 wherein the interior surface finish of said cover tape reservoir includes a series of random grooves.

7. The component tape feeder of claim 1 wherein the perimeter of the cover tape reservoir is defined by a curvilinear path.

8. The component tape feeder of claim 1, wherein the cover tape drive includes gears with a tooth profile that engages and corrugates the cover tape into segments.

9. The component feeder of claim 1, wherein the folding pulley is rotatably installed on a frame, and includes at least one channel with a predetermined shape and includes an associated splice deflector, said cover tape drive further comprising;

a pair of cover tape gears with the cover tape in a nip formed therebetween; and a drive means for transferring a rotational force to the cover tape gears; wherein the cover tape gears impart a tensile force to draw the cover tape into a single folding pulley and thereby fold the edges concurrently therewithin.

10. The component feeder as claimed in claim 9, wherein said channel has at least two inwardly inclined flanges extending from the outer circumference of the pulley and narrowing toward a hub of said single folding pulley.

11. The component feeder as claimed in claim 10, wherein the root of the channel formed by the two inclined flanges within the folding pulley are undercut between the hub and the inclined flanges.

12. The component feeder as claimed in claim 10, wherein the splice deflector is located between the inwardly inclined flanges and contacts the cover tape whenever a cover tape splice passes over folding pulley.

13. A method for handling cover tape detached from pocket tape, comprising:

folding the longitudinal edges of the cover tape inward to enclose within folded confines of the tape any residual adhesive, wherein folding the longitudinal edges inward increases the stiffness of the cover tape;

corrugating the folded tape as it is pushed into a cover tape reservoir; and monitoring the quantity of cover tape contained in the cover tape reservoir.

14. The method as claimed in claim 13 wherein the step of folding the cover tape comprises pulling the cover tape into a folding pulley including a channel having inclined flanges and at least one undercut between one of said inclined flanges and a hub.

15. The method as claimed in claim 13 wherein corrugating the folded cover tape comprises passing the cover tape through a nip formed between a first cover tape gear and a second cover tape gear, each of said cover tape gears having a plurality of teeth in engagement.

* * * * *